(12) United States Patent
Olson et al.

(10) Patent No.: US 6,933,870 B2
(45) Date of Patent: Aug. 23, 2005

(54) METHOD AND APPARATUS FOR EFFICIENT MIXED SIGNAL PROCESSING IN A DIGITAL AMPLIFIER

(75) Inventors: Erlend Olson, Duarte, CA (US); Ion Opris, San Jose, CA (US)

(73) Assignee: Broadcom Corporation, Irvine, CA (US)

(*) Notice: Subject to any disclaimer, the term of this patent is extended or adjusted under 35 U.S.C. 154(b) by 214 days.

(21) Appl. No.: 09/768,674

(22) Filed: Jan. 24, 2001

(65) Prior Publication Data

US 2001/0005174 A1 Jun. 28, 2001

Related U.S. Application Data

(62) Division of application No. 09/346,361, filed on Jul. 1, 1999.

(51) Int. Cl.[7] .............................................. H03M 3/00
(52) U.S. Cl. ...................................... 341/143; 375/245
(58) Field of Search ................................ 341/143, 118, 341/120, 155, 110; 375/245, 346, 347, 247; 327/113, 105; 330/10; 708/313

(56) References Cited

U.S. PATENT DOCUMENTS

| | | | |
|---|---|---|---|
| 4,349,754 A | | 9/1982 | Bull |
| 5,257,026 A | * | 10/1993 | Thompson et al. .......... 341/118 |
| 5,274,375 A | * | 12/1993 | Thompson ................... 341/143 |
| 5,327,137 A | * | 7/1994 | Scheerer et al. ............. 341/168 |
| 5,508,647 A | | 4/1996 | Okamoto |
| 5,617,090 A | * | 4/1997 | Ma et al. ..................... 341/141 |
| 5,701,106 A | | 12/1997 | Pikkarainen et al. |
| 5,974,089 A | | 10/1999 | Tripathi et al. |
| 6,111,532 A | * | 8/2000 | Hirano et al. ................ 341/143 |
| 6,137,429 A | * | 10/2000 | Chan et al. .................. 341/143 |
| 6,151,613 A | * | 11/2000 | Khoini-Poorfard .......... 708/313 |
| 6,215,423 B1 | * | 4/2001 | May et al. ............... 341/143 X |
| 6,362,763 B1 | | 3/2002 | Wang |
| 6,414,613 B1 | | 7/2002 | Midya et al. |
| 6,587,060 B1 | * | 7/2003 | Abbey ........................ 341/143 |

FOREIGN PATENT DOCUMENTS

WO    WO 00/35082    6/2000

OTHER PUBLICATIONS

A. J. Magrath, et al., "Power Digital–to–Analogue Conversion Using a Sigma–Delta Modulator with Controlled Limit Cycles," *Electronics Letters*, Feb. 16, 1995, pp. 251–253, vol. 31, No. 4, IEE, Stevenage, Herts, GB. (XP000513671).

* cited by examiner

*Primary Examiner*—Patrick Wamsley
(74) *Attorney, Agent, or Firm*—Christie, Parker & Hale, LLP (57) ABSTRACT

A system and method of creating a highly efficient digital amplifier which can take either analog or digital inputs, and produce a high power accurate representation of the input to drive speakers or other low impedance load is described. The system employs a transition detector and delay unit which allows the comparator of the signal modulator to ignore its inputs for a pre-determined number of subsequent clock cycles once an output transition has been detected. Through the use of faster clocks and variable clock cycle skips upon the comparator's output transition, finer resolution of the feedback's clock period for noise-shaping purposes is achieved. Finer resolution of the clock period allows the present invention to employ a more aggressive noise-shaping than previously possible.

In another aspect of the invention, additional delta-sigma modulator noise suppression is obtained by using the common bridge implementation of the power output stage with the improvement of configuring the bridge to create a 3-state condition instead of the conventional 2 states. By controlling the two halves of the bridge independently of one another, an output with 3 states makes for improved noise shaping performance.

7 Claims, 8 Drawing Sheets

METHOD AND APPARATUS FOR EFFICIENT MIXED SIGNAL PROCESSING IN A DIGITAL AMPLIFIER

This application is a division of Ser. No. 09/346,361 filed Jul. 1, 1999.

BACKGROUND OF THE INVENTION

1. Field of the Invention

The present invention relates to the field of switching amplifiers. More specifically, the present invention relates to a novel method of sampling in the signal modulation stage of a digital amplifier to achieve a highly accurate representation of the input signal at substantial gain.

2. Description of the Related Art

There have been various developments pertaining to oversampled, noise-shaping signal processing. These developments have been applicable to both continuous-time (analog) and discrete-time (digital or sampled analog) signals. The constant struggle in this field is to increase the efficiency of the amplifiers. Given the myriad of applications of sound applications in the electronics of today, it is apparent that an efficient audio amplification is highly desirable.

Figure 1:
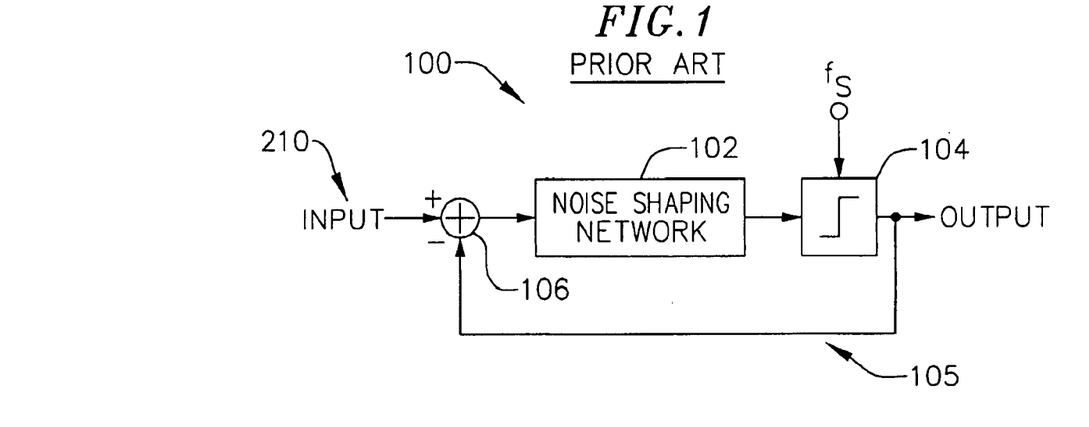
FIG. 1 is a schematic representation of a prior art first order delta-sigma modulator.

In response to this need, attempts have been made to design switching audio amplifiers using oversampled, noise-shaping modulators, especially delta-sigma modulators. A prior art first order delta-sigma modulator is shown in FIG. 1. A noise shaping network 102 is connected in series with a comparator 104, which is a 1-bit quantizer with sampling rate $f_s$. The output 105 of the comparator is fed back to the noise shaping network via summation element 106. The feedback in turn forces the average value of the quantized output signal to track the average value of the input to the modulator 100. Any difference between the quantized output and modulator input is accumulated in the noise shaping network 102 and eventually corrected. For first-order delta-sigma modulators, noise in the signal band due to quantization error is reduced by approximately 9 dB for each doubling of the oversampling ratio (OSR). The OSR is given by $f_s/2f_o$, where $2f_o$ is the Nyquist rate, i.e., twice the bandwidth $f_o$ of the baseband signal, and $f_s$ is the previously mentioned 1-bit quantizer's sampling rate. For second-order delta-sigma modulators, this noise is reduced by approximately 15 dB (9 dB+6 dB) for the same increase in OSR. However, noise improvements achieved by increases in the OSR, i.e., increases in $f_s$, are ultimately limited as the rise and fall times of the output signal become significant with respect to the sample period.

Accordingly, it would be highly desirable to employ aggressive noise shaping while at the same time maintaining a fixed signal feedback rate for improved noise shaping. This would allow efficient application of audio amplification in many of today's electronics such as multimedia computers.

SUMMARY OF THE INVENTION

A system and method of creating a highly efficient digital amplifier which can take either analog or digital inputs, and produce a high power accurate representation of the input to drive speakers or other low impedance load is described. The system employs a transition detector and delay unit which allows the comparator of the signal modulator to ignore its inputs for a pre-determined number of subsequent clock cycles once an output transition has been detected. Through the use of faster clocks and variable clock cycle skips upon the comparator's output transition, finer resolution of the feedback's clock period for noise-shaping purposes is achieved. Finer resolution of the clock period allows the present invention to employ a more aggressive noise-shaping than previously possible.

In another aspect of the invention, additional delta-sigma modulator noise suppression is obtained by using the common bridge implementation of the power output stage with the improvement of configuring the bridge to create a 3-state condition instead of the conventional 2 states. By controlling the two halves of the bridge independently of one another, an output with 3 states makes for improved noise shaping performance.

DETAILED DESCRIPTION OF THE PREFERRED EMBODIMENT

The present description is of the best presently contemplated mode of carrying out the invention. This description is made for the purpose of illustrating the general principles of the invention and should not to be taken in a limiting sense. The scope of the invention is best determined by reference to the appended claims.

Figure 2A:
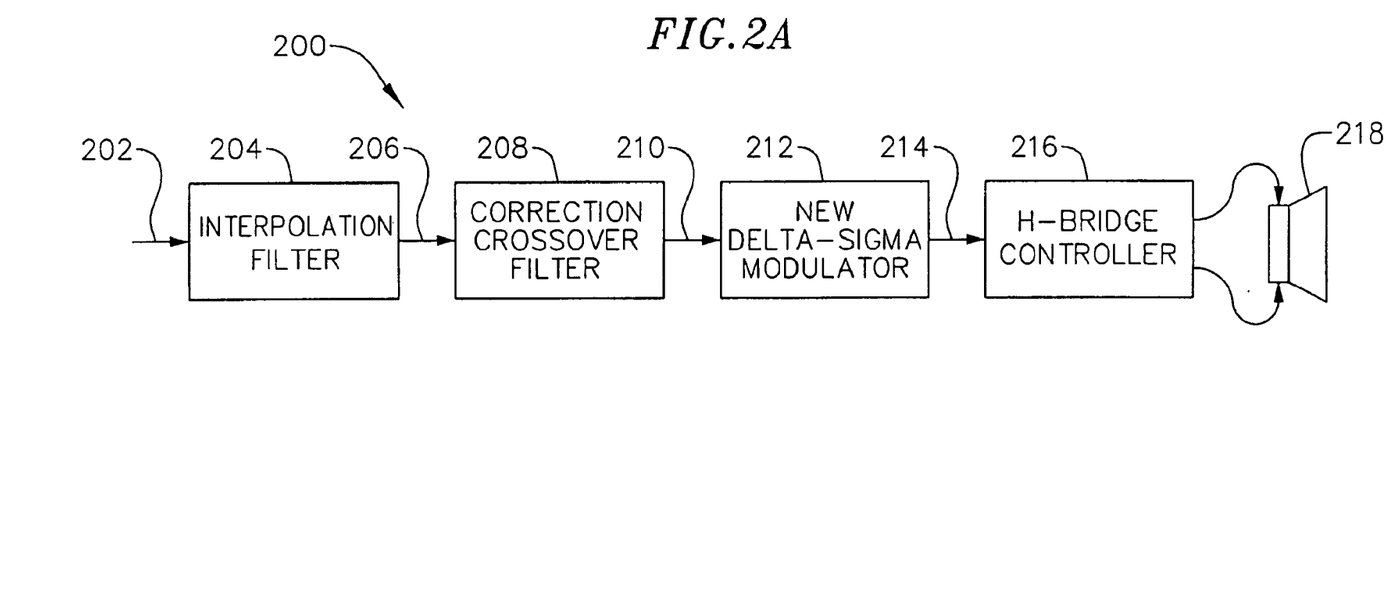
FIG. 2A is a schematic representation of one embodiment of a digital amplifier which incorporates the present invention for processing digital inputs.

The present invention will be described in reference to a 1-bit digital amplifier 200. Referring to FIG. 2A, the input may be a digital signal 202 consisting of typically a 16 bit or 18 bit digital input. In this example, it may be a digital audio input at 48 kHz. A digital interpolation filter 204, converts the low rate, multi-bit signal 202 to a high rate multi-bit signal 206. The signal 206 consists of typically 16 to 22 bits in an audio application at a sample rate of typically 32 to 128 times the original sample rate at 202. An additional digital filter 208 can also be added, which performs two functions. First, it performs a typical crossover function commonly used in audio to divide up the frequency content of the incoming signal 202, in order to more carefully parameterize for proper reproduction of signals through the subsequent signal path. Second, it performs a pre-warping of the signal frequency content such that after the signal 210 is subsequently warped through the non-linear mechanical response of the speaker 218, the resulting audio has flat frequency response to the listener. The signal 210 then enters the new type of delta-sigma modulator 212. This new type of modulator, further described below, then outputs a signal 214 which possess certain special characteristics also further described below. Finally, the signal at 214 then drive a typical H-bridge controller 216, which directly drives the speakers 218.

Figure 2B:
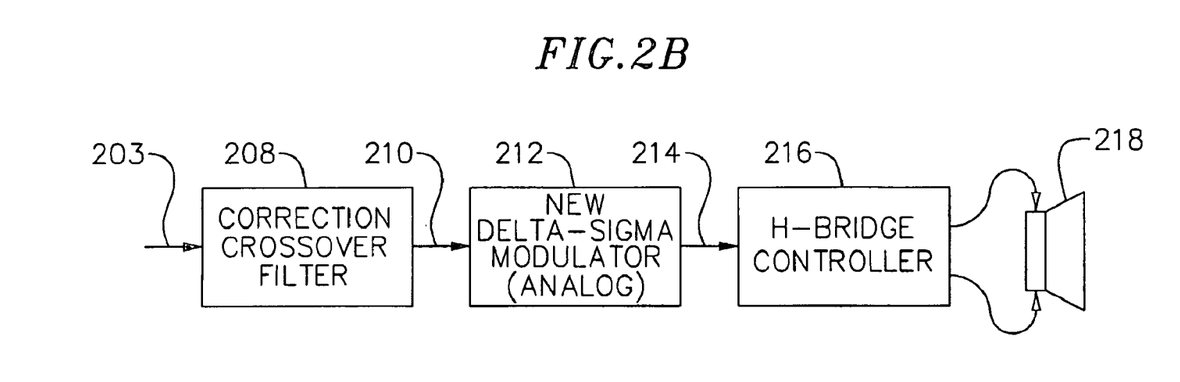
FIG. 2B is a schematic representation of one embodiment of a digital amplifier that incorporates the present invention for processing analog inputs.

Referring to FIG. 2B, the core of the 1-bit digital amplifier, consisting of the delta-sigma modulator 212 and the H bridge controller 216, can also be used in an embodiment that receives an analog signal 203, instead of a digital signal 202. For the analog input signal 203, an interpolation filter is not required.

Figure 3:
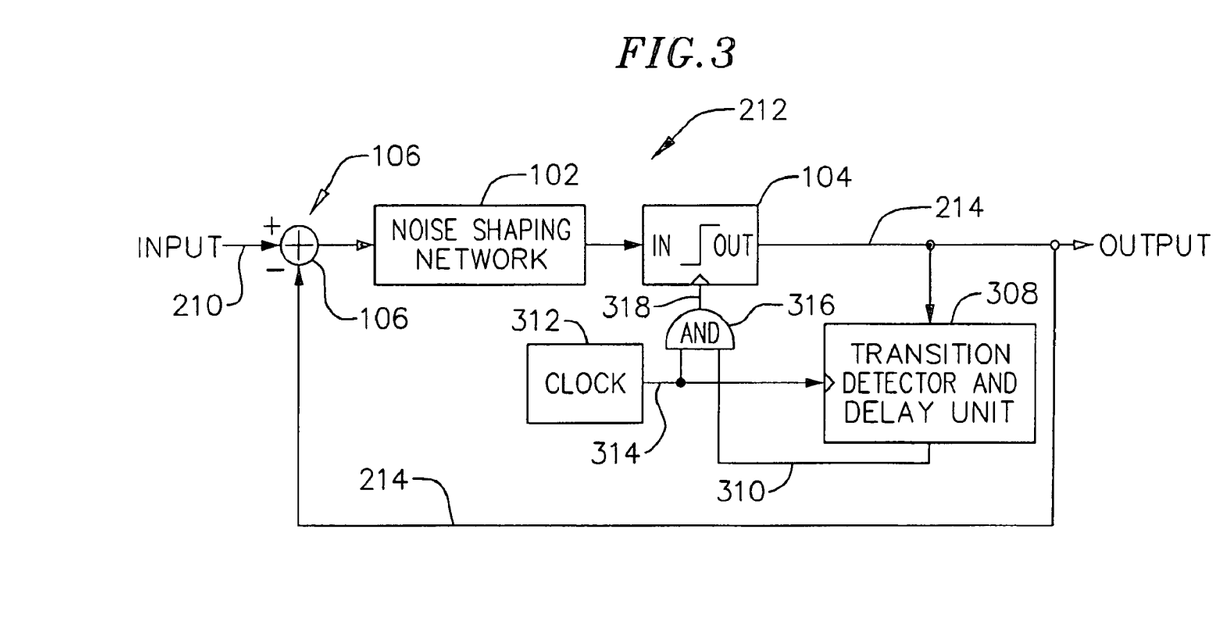
FIG. 3 is a schematic representation of the new implementation of a sigma-delta modulator in accordance with the present invention.
Figure 4:
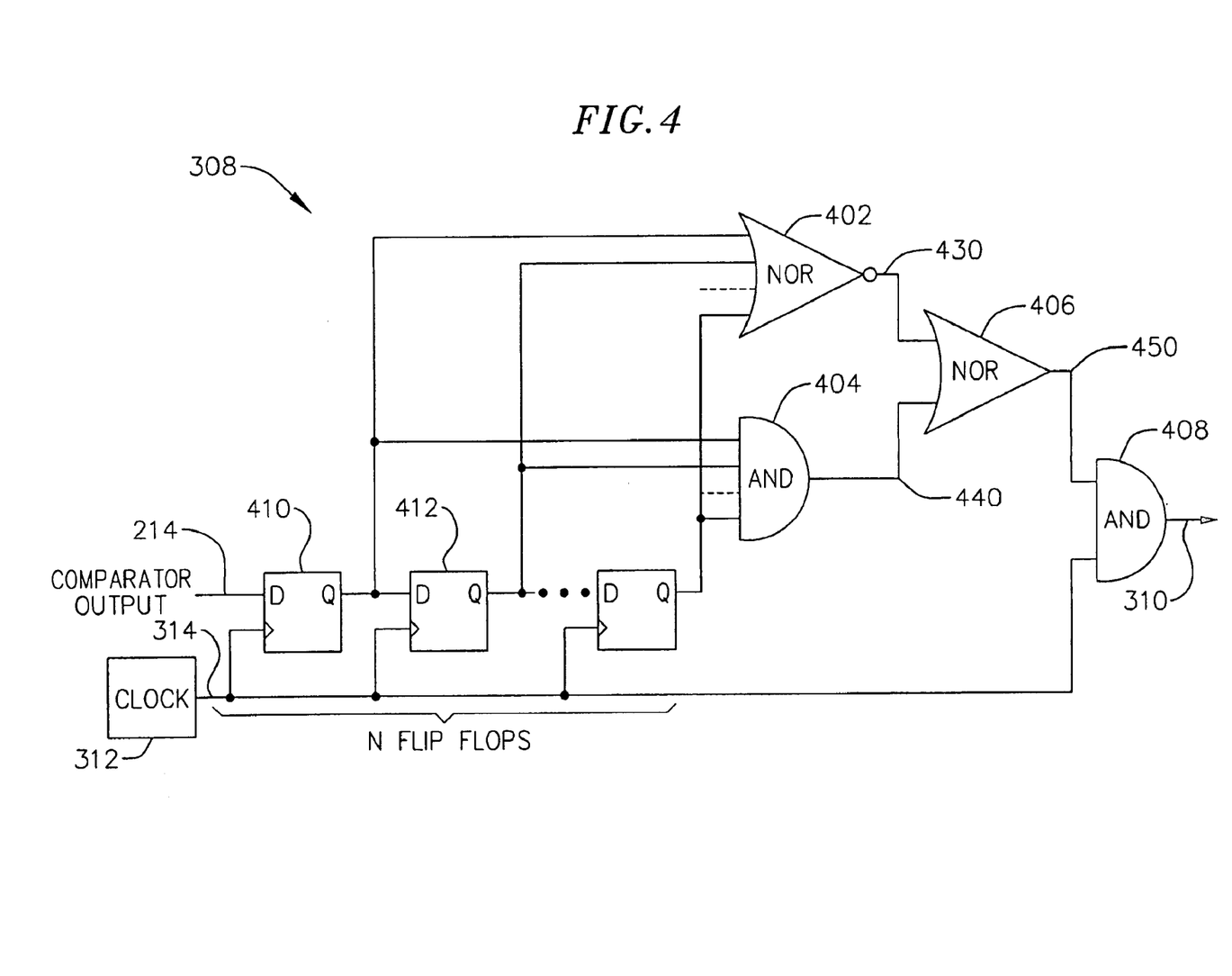
FIG. 4 is a schematic representation of an embodiment of the transition detector and delay unit of FIG. 3.

Referring to FIG. 3, delta-sigma modulator 212 of FIG. 2 is shown in further detail. The configuration may be applied to any single loop 1-bit feedback delta-sigma modulator as indicated in FIG. 1. In FIG. 3, output 214 of the comparator 104 is fed back to the noise shaping network along with input 210 via summation element 106. The noise shaping network 102 is coupled to the comparator 104 which is then coupled to the transition detector and delay unit 308. The output 310 of the transition detector and delay unit 308 provides the inputs of the AND gate 316. The output 318 of the AND gate 316 provides the clock input of the comparator 104. This clock input 318 determines the moment when the comparator output 214 gets updated. The transition detector and delay unit 308 allows the comparator 104 to ignore its inputs for a predetermined number of subsequent clock cycles once an output transition has been detected. In other words, when the comparator output 214 goes through a transition (e.g., from 0 to 1 or from 1 to 0), the output 310 from the transition detector and delay unit 308 is always a "0" to disable the comparator 104. The comparator 104 in such an instance is disabled since the output 318 of the AND gate 316 will always be a "0" if at least one of its inputs is a "0". A possible implementation of the of the transition detector and delay unit 308 is shown in FIG. 4. In this implementation, N flip-flops 410, 412, and so forth are employed to provide an output 310 such that inputs to the comparator 104 will be ignored for a period of N clock cycles following a transition in the comparator output 214. Thus, N is a variable value which may be adjusted to achieve specified results. As illustrated in FIG. 4, the transition detector and delay unit 308 employs a NOR gate 402 and an AND gate 404. Basically, the OR gate 406 will provide output 450 of "1" if either output 430 from the NOR gate 402 or the output 440 from the AND gate 404 is a "1". The only way for a NOR gate to produce an output of "1" is to have all its inputs be "0". The only way for an AND gate to produce an output of "1" is to have all its inputs be "1". Therefore, it is clear that any combination of "0" and "1" as the inputs for either the NOR gate 402 or AND gate 404 will result in each respective output to be "0". This configuration allows the comparator 104 to effectively ignore its inputs 210 for a pre-determined number of clock cycles once its output 214 has gone through a transition.

The end result of this arrangement is that the comparator output 214, and therefore the drive signal 214 for the H-bridge controller 216, cannot change states faster than the clock frequency of the delta-sigma modulator divided by N, which is significantly lower than the clock frequency. Since the feedback 214 in the 1-bit delta sigma modulator (FIG. 1) is basically disabled during the non-responsive period (N clock cycles) of the comparator 104, the stability of the loop is affected. Therefore, the noise shaping afforded by the delta-sigma converter has to be less aggressive than that typically cited in such designs where the feedback is expected to be responsive at the clock frequency. However, this is assuming that the clock frequency of the modulator remains the same. If a faster clock is employed to offset the increasing value of N, then the comparator response and hence the feedback signal is a feedback at the frequency of the faster clock divided by N, but with a finer resolution of the clock period, since the "high" or "low" output of the comparator can exist for N clocks, N+1 clocks, N+2 clocks, and so on.

For example, assume that for N=1, a clock with a frequency of 1 MHz (period of 1 $\mu$s) is used in the modulator. So, with N=1, there is no delay caused by the transition in comparator output and the feedback occurs at a frequency of 1 MHz. Now, assume that for N=10, a clock with a frequency of 10 MHz (period of 10 $\mu$s) is used in the modulator. Then, every transition of the comparator output causes the comparator to ignore its inputs for 10 clock cycles. However, since the faster clock has a frequency of 10 MHz, the feedback frequency is still 1 MHz (10 MHz divided by N=10). With the feedback frequency remaining the same by using a faster clock, this invention maintains the desired feedback frequency rate while at the same time achieving finer resolution of the clock period of $\frac{1}{10}$ $\mu$s. Finer resolution of the clock period allows the present invention to employ a more aggressive noise-shaping than previously possible. A complete theory of delta-sigma modulator basic design can be found in "Delta-Sigma Data Converters—Theory, Design and Simulation" edited by S. R. Norsworthy, R. Schreier and G. Temes, IEEE Press, 1996 pp. 152–155 and pp. 178–183.

A noise shaping function that maintains stability with the approach described herein can be obtained by adjusting the coefficients of a standard noise shaping function. Unfortunately, since sigma-delta converters are based on the non-linear function of the 1-bit quantizer (the comparator), there is no general linear stability theory currently in existence for loop orders higher than two, but the stability of the loop can only be verified through simulations.

Figure 5:
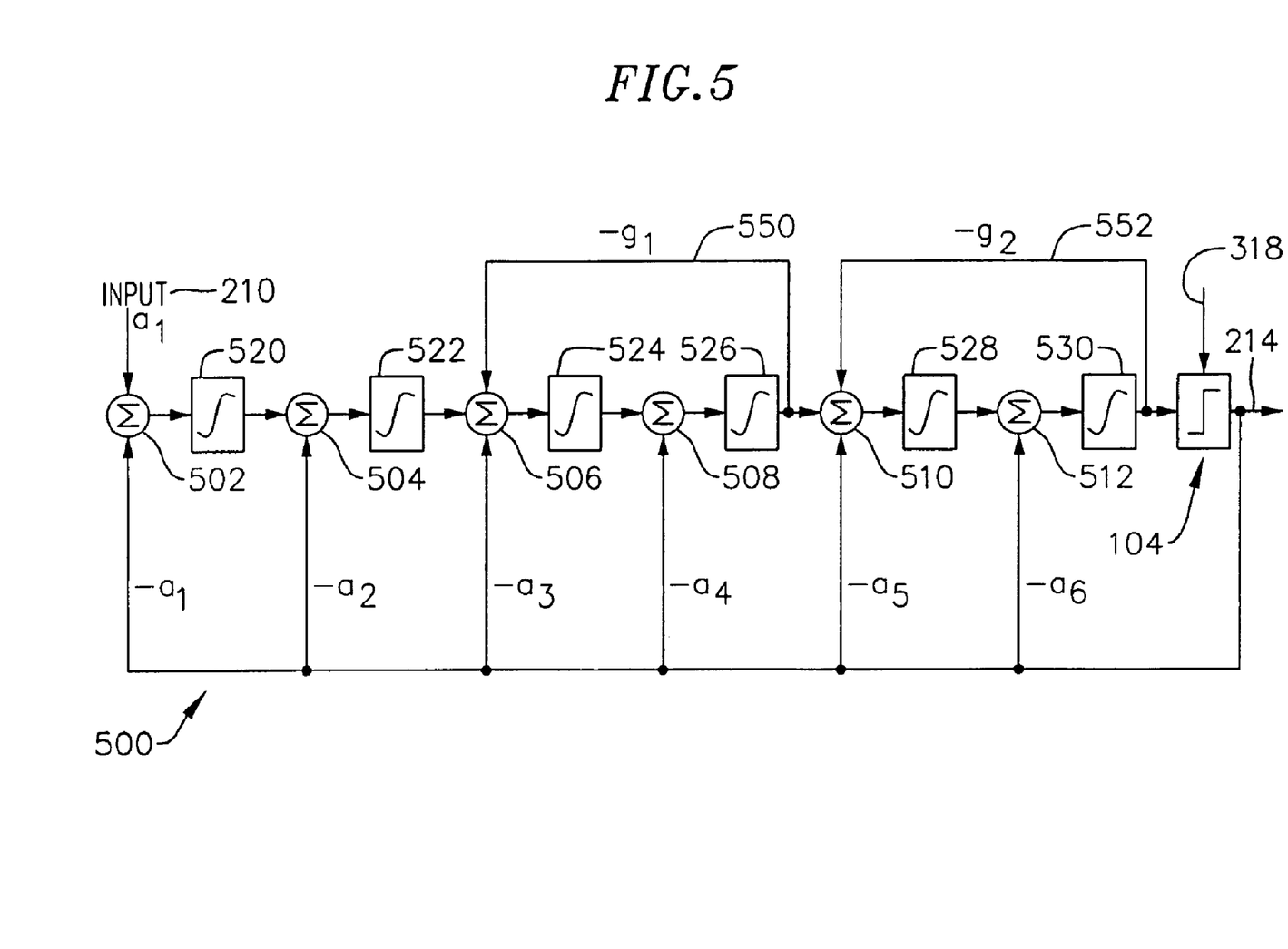
FIG. 5 is a schematic representation of a single-loop 1-bit feedback 6th order sigma-delta modulator which incorporates the present invention.
Figure 6:
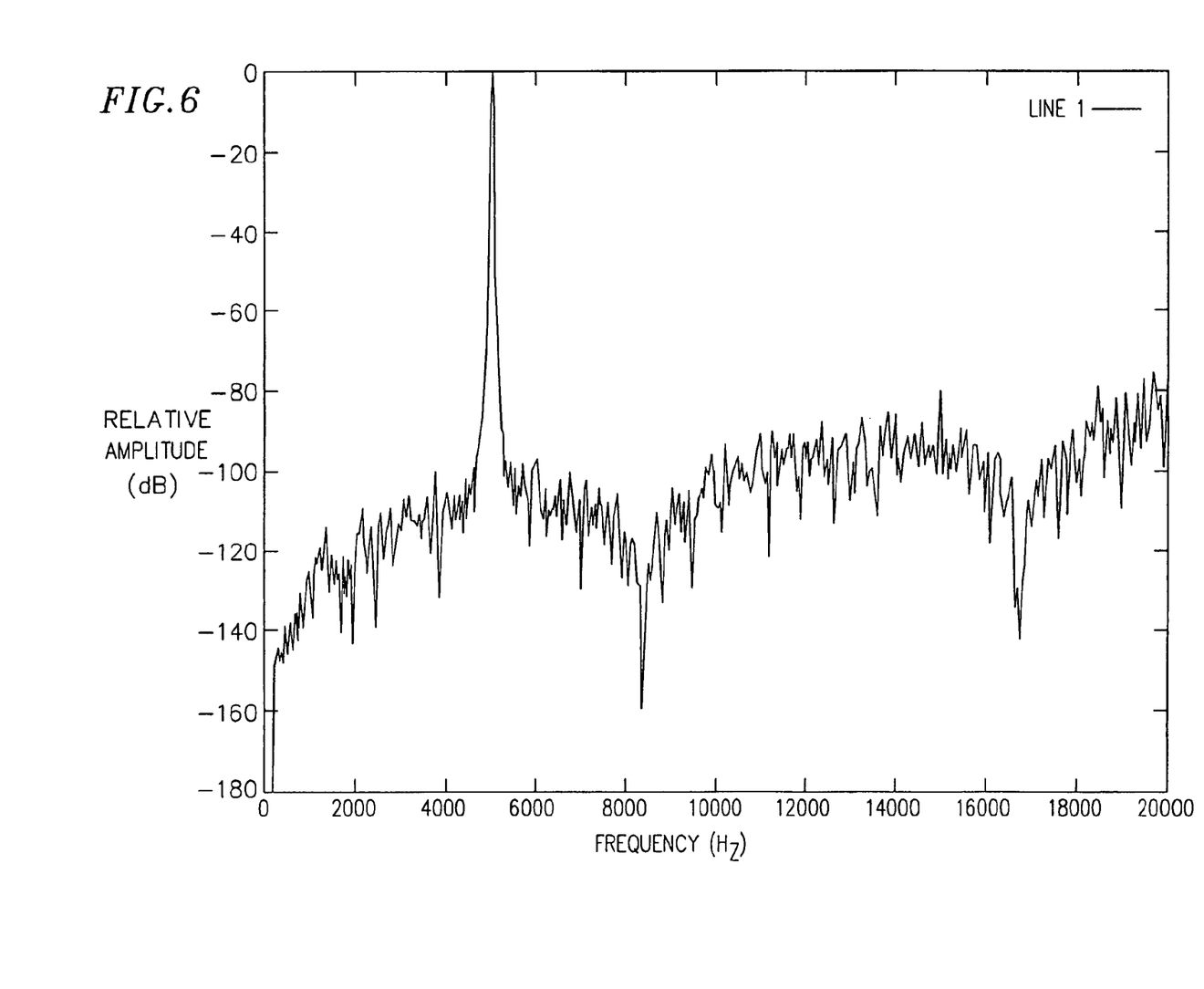
FIG. 6 is a graph of the signal spectrum for a conventional 6th order delta-sigma modulator with $F_{clock}=1$ MHz.
Figure 7:
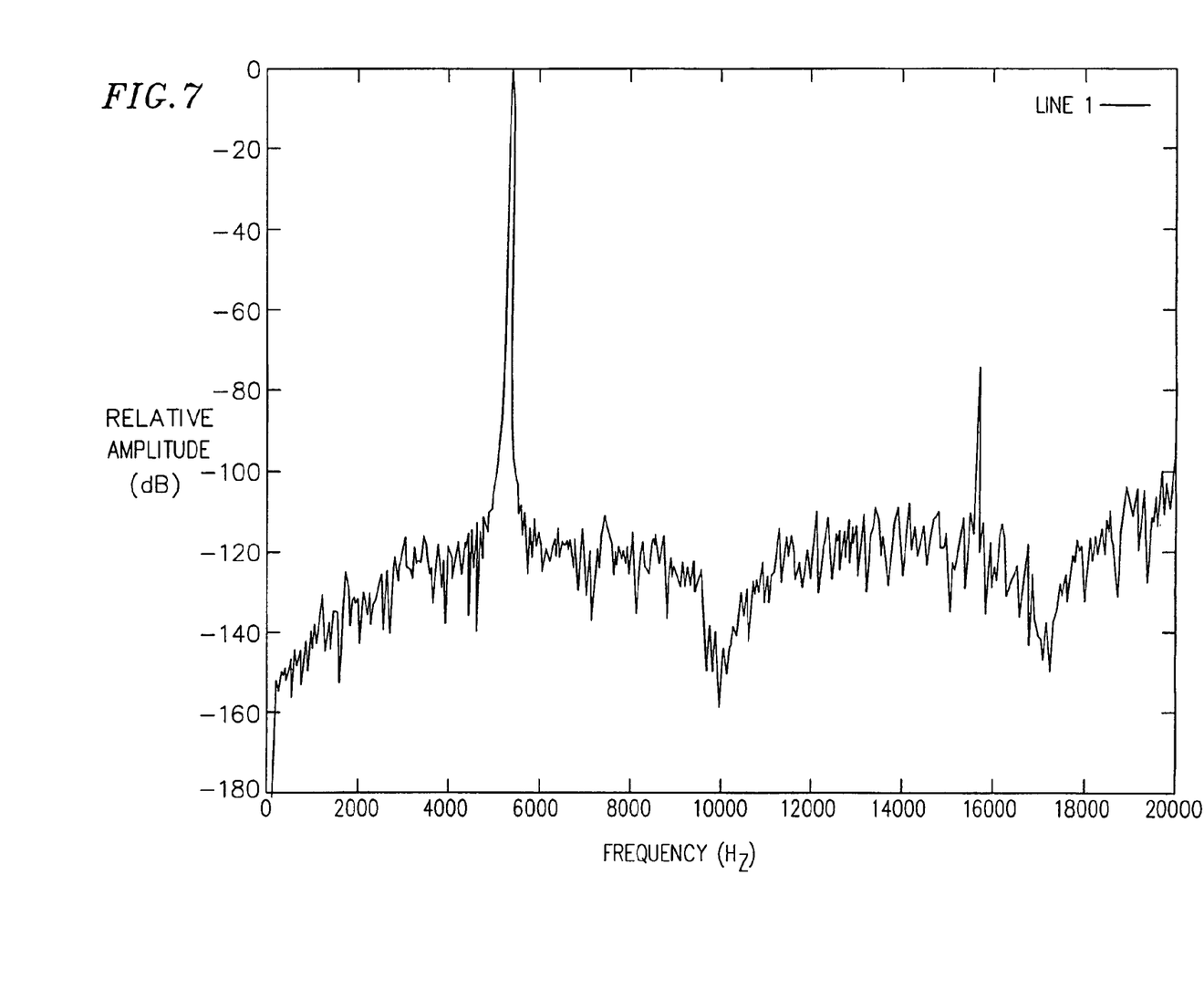
FIG. 7 is a graph of the signal spectrum for a 6th order delta-sigma modulator with $F_{clock}=10$ MHz and $N=10$ according to an embodiment of the present invention.

A digital amplifier involving a conventional single-loop 1-bit feedback 6th order delta-sigma modulator 500 is shown in FIG. 5. Referring to FIG. 5, there are six summation elements 502, 504, 506, 508, 510, 512 coupled in series to six integrators 520, 522, 524, 526, 528, 530. The input 210 is fed into the system via summation element 502 and is eventually fed as the input to the comparator 104. The output 214 of the comparator 104 is fed back to each of the six summation elements of the modulator 500. An example of the output of such a digital amplifier with Fclock=1 MHz which achieves 69 dB signal-to-noise ratio (SNR) in a 20 kHz BW, is shown in FIG. 6. It has an output clock, and hence comparator resolution and power device switching time of 1 $\mu$s. By using a 10 MHz clock instead with N=10 (again then, the minimum comparator resolution is 1 $\mu$s), in accordance with one embodiment of the present invention, the SNR in the same 20 kHz band is 90 dB, as indicated by the signal-to-noise ratio (SNR) in FIG. 7. The feedback coefficients for this particular example are:

$a6=6(1-a)$ $a5=15(1-a)^2$ $a4 = 20(1-a)^3$ $a3 = 15(1-a)^4$ $a2 = 6(1-a)^5$ $a1 = (1-a)^6$ $g1 = 1.2E-4$ $g2 = 4.0E-5$ where a is a parameter close to 1 used for stability simulations (a=0.98 in this example), and g1 and g2 are resonator settings, as indicated in FIG. 5. As previously mentioned, the method is equally applicable to analog or digital implementations.

Figure 8:
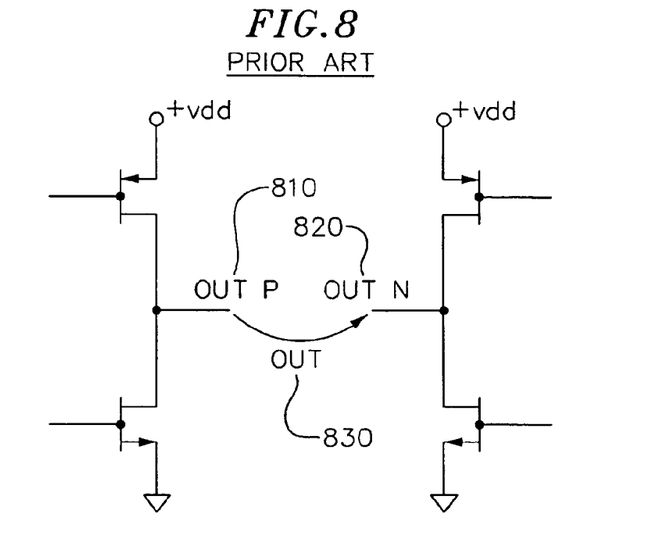
FIG. 8 is a schematic representation of bridge output as existing in the prior art.
Figure 9:
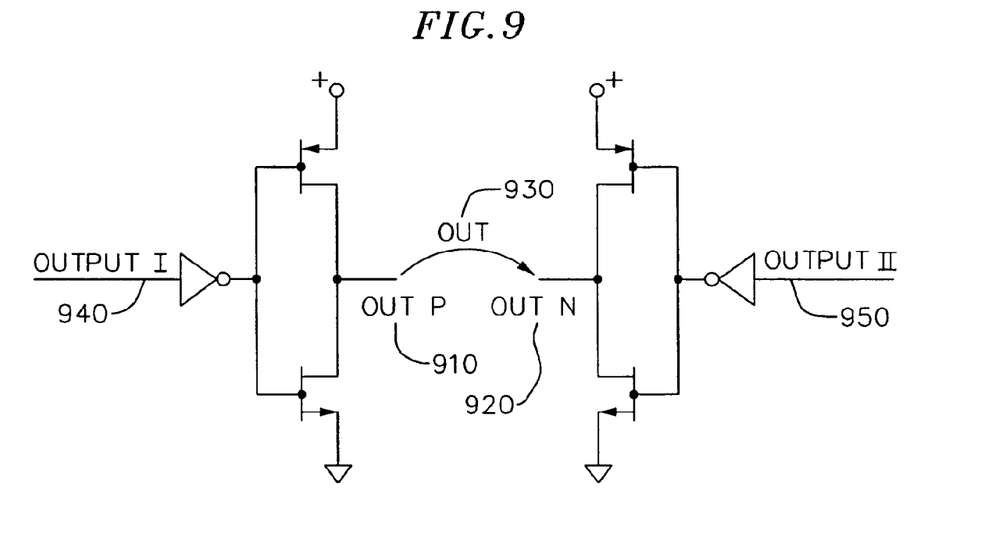
FIG. 9 is a schematic representation of bridge circuit in accordance with one embodiment of the present invention.
Figure 10:
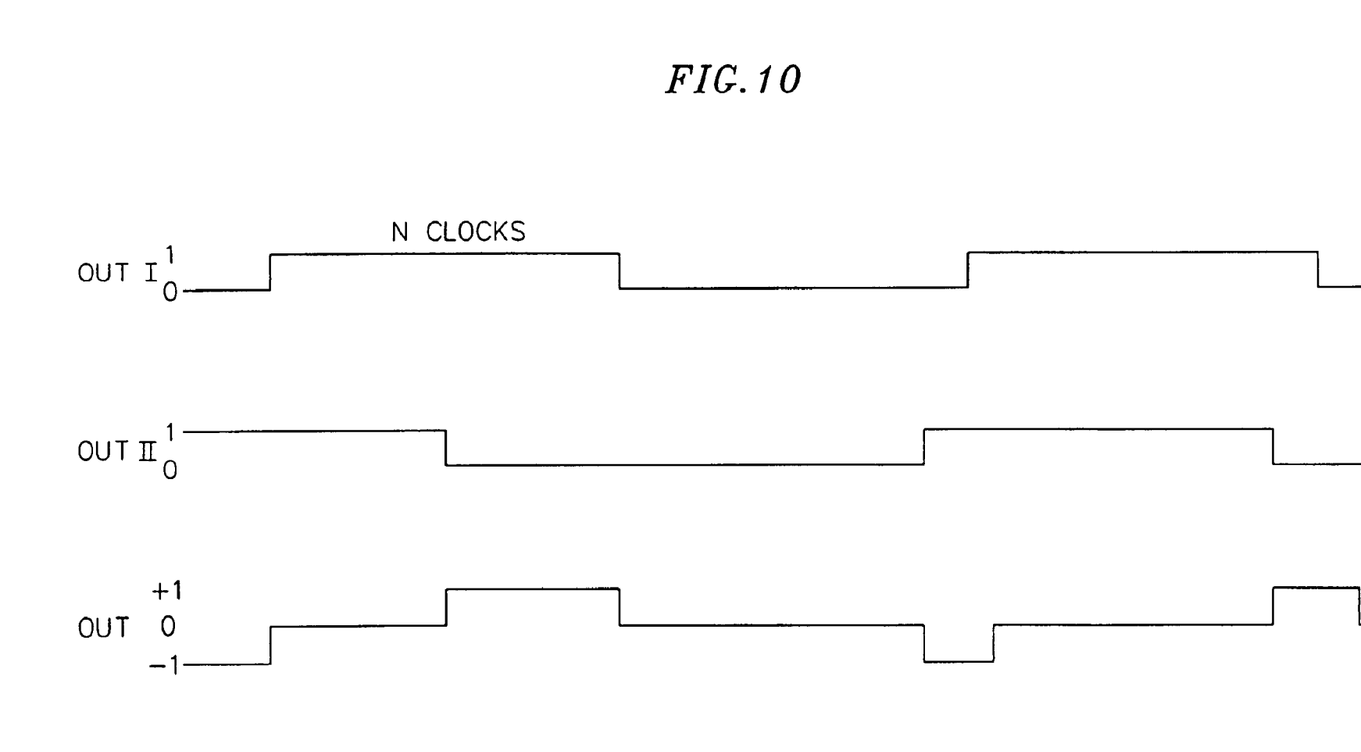
FIG. 10 is an output diagram of the bridge circuit in FIG. 9.

In another aspect of the invention, a novel technique employed in the H-bridge controller 216 of FIG. 2 is disclosed. It relates to the technique previously described for the delta-sigma converter. Referring to the prior art as shown in FIG. 8, the bridge Output P 810 and Output N 820 are dependent on one another. In other words, Output P 810 and Output N 820 are both $-V_{dd}$ or $+V_{dd}$. Thus, with the Output 830=Output P 810–Output N 820, the peak-to-peak maximum amplitude is $2V_{dd}$ (either $+2V_{dd}$ or $-2V_{dd}$). Additional delta-sigma modulator noise suppression can be obtained by using the common bridge implementation of the power output stage shown in FIG. 9, with the improvement of configuring the bridge to create a 3-state condition instead of the conventional 2 states. By controlling the two halves of the bridge independently of one another, Output P 910 and Output N 920 have values independent from one another. Thus, four different possible permutations exist for values of Output I 940 and Output II 950. The combination of these four values determine the three states of Output 930 value, since Output=Output I–Output II. The Output 930 thus has three states as shown in FIG. 10. The delta-sigma modulator feedback can then also be interpreted as 3 states instead of only 2, and the noise-shaping performance of the loop is improved by an additional 3 dB. By adding the third state to the feedback the stability of the loop is improved and the noise shaping function can be designed more aggressively. Moreover, the gating mechanism for the two legs can be independent, so output changes faster than $T_{clock}*N$ can occur at the output without any device in the H-bridge switching faster than $F_{clock}/N$. This result can be seen in FIG. 10, where the period of Output I and Output II at any given state (0 or 1) span at least as long as $T_{clock}*N$. However, because Output is equal to the value of Output I–Output II (a combination of two independent results), the period of Output's state (–1, 0, or 1) can be shorter than $T_{clock}*N$.

Therefore, the state transition of Output may occur at a rate faster than $F_{clock}/N$.

What is claimed is:

1. A modulation stage for signal shaping comprising:
   means for preliminary noise-shaping of an input signal;
   discrete-time sampling means having a predetermined sampling frequency, the discrete-time sampling means being coupled to the noise-shaping means to produce an output signal with a lower transition rate with respect to said sampling frequency by a predetermined multiple; and
   a sampling means output clock for clocking the discrete-time sampling means to produce an output signal with a lower transition rate being fed back to the means for preliminary noise-shaping to sum with the input signal.

2. A modulation stage for signal shaping of claim 1 wherein the discrete-time sampling means includes means for suppressing sampling of the input signal for a set number of clock cycles in response to the sampling means output clock.

3. A modulation stage for signal shaping of claim 2 wherein the means for suppressing sampling includes means for detecting a transition in the output signal.

4. A modulation stage for signal shaping within a digital amplifier, the modulation stage comprising:
   a noise shaping network for preliminary noise shaping of an input signal;
   a discrete-time sampling circuit having a predetermined sampling frequency, the discrete-time sampling circuit comprising a quantizer coupled to the noise shaping network; and
   a quantizer output clock for clocking the discrete-time sampling circuit to generate an output signal with a lower transition rate with respect to the predetermined sampling frequency by a predetermined multiple, the output signal with a lower transition rate being fed back to the noise-shaping network to sum with the input signal.

5. The modulation stage of claim 4, wherein the discrete-time sampling circuit includes a logic circuit for generating the output of the quantizer output clock to suppress sampling of the input signal for a set number of clock cycles of a sampling frequency clock.

6. The modulation stage of claim 5, wherein the logic circuit includes a transition detector for detecting a transition in the output signal.

7. The modulation stage of claim 4, wherein the output signal has a multi-state output, having at least three states.

* * * * *

UNITED STATES PATENT AND TRADEMARK OFFICE
CERTIFICATE OF CORRECTION

PATENT NO. : 6,933,870 B2
APPLICATION NO. : 09/768674
DATED : August 23, 2005
INVENTOR(S) : Olson et al.

It is certified that error appears in the above-identified patent and that said Letters Patent is hereby corrected as shown below:

On the Title Page

| | |
|---|---|
| (56) References Cited | Insert --5,077,539 A   12/1991   Howatt-- |
| (56) References Cited | Insert --5,617,058 A   4/1997   Adrian et al.-- |
| (56) References Cited | Insert --5,777,512 A   7/1998   Tripathi et al.-- |
| (56) References Cited | Insert --Steven R. Norsworthy, et al. ed., Delta-Sigma Data Converters-Theory, Design and Simulation, pp. 152-155, 178-183, IEEE Press, New York.-- |

In the Drawings

FIG. 4, Sheet 3 of 8 — Delete Drawing Sheet 3 and substitute therefore the Drawing Sheet, consisting of Fig. 4, as shown on the attached page Signed and Sealed this Twenty-seventh Day of February, 2007

JON W. DUDAS
*Director of the United States Patent and Trademark Office*

FIG.4